United States Patent
Wang et al.

(10) Patent No.: US 10,348,090 B2
(45) Date of Patent: Jul. 9, 2019

(54) METHOD OF DETERMINING A CONDITION OF AN ELECTRICAL POWER NETWORK AND APPARATUS THEREFOR

(71) Applicant: PSYMETRIX LIMITED, Edinburgh, Lothian (GB)

(72) Inventors: David Tse-Chi Wang, Edinburgh (GB); Douglas Wilson, Edinburgh (GB)

(73) Assignee: PSYMETRIX LIMITED, Edinburgh Lothian (GB)

( * ) Notice: Subject to any disclaimer, the term of this patent is extended or adjusted under 35 U.S.C. 154(b) by 0 days.

(21) Appl. No.: 14/903,586

(22) PCT Filed: Jul. 8, 2014

(86) PCT No.: PCT/GB2014/052082
§ 371 (c)(1),
(2) Date: Jan. 7, 2016

(87) PCT Pub. No.: WO2015/004447
PCT Pub. Date: Jan. 15, 2015

(65) Prior Publication Data
US 2016/0380433 A1     Dec. 29, 2016

(30) Foreign Application Priority Data

Jul. 9, 2013  (GB) .................................. 1312267.6

(51) Int. Cl.
*H02J 3/16*      (2006.01)
*H02J 3/00*      (2006.01)
(Continued)

(52) U.S. Cl.
CPC ............... *H02J 3/16* (2013.01); *G01R 31/40* (2013.01); *H02J 3/00* (2013.01); *H02J 13/00* (2013.01);
(Continued)

(58) Field of Classification Search
CPC ....................................................... H02J 3/16
See application file for complete search history.

(56) References Cited

U.S. PATENT DOCUMENTS

2014/0244189 A1*  8/2014  Chiang .............. G01R 19/2513
                                                702/61

FOREIGN PATENT DOCUMENTS

EP     1780858      5/2007
EP     1850441      10/2007
(Continued)

OTHER PUBLICATIONS

International Search Report of Counterpart PCT International Application No. PCT/GB2014/052082.
(Continued)

*Primary Examiner* — Daniel C Puentes
(74) *Attorney, Agent, or Firm* — Fitch, Even, Tabin & Flannery LLP

(57) ABSTRACT

The present invention relates to apparatus 30 for determining a condition of a network section 34 comprised in an electrical power network 32. The network section 34 is configured such that electrical power flows to or from each of plural locations in the network section. The apparatus 30 is configured to receive a first quantity in respect of a first location in the network section 34 and to receive a second quantity in respect of a second location in the network section, each of the first and second quantities corresponding to a signal amplitude and a signal phase angle at its respective location. The apparatus 30 comprises a processor 42 which is operative to determine a condition quantity corresponding to a loading condition of the network section 34 between the first and second locations in dependence on the first and second quantities.

18 Claims, 7 Drawing Sheets

(51) Int. Cl.
*G01R 31/40* (2014.01)
*H02J 13/00* (2006.01)

(52) U.S. Cl.
CPC ....... *H02J 2003/007* (2013.01); *Y02E 60/728* (2013.01); *Y02E 60/76* (2013.01); *Y04S 10/265* (2013.01); *Y04S 40/22* (2013.01)

(56) References Cited

FOREIGN PATENT DOCUMENTS

| EP | 1887673 | 2/2008 |
|----|---------|--------|
| WO | 2011/061538 | 5/2011 |
| WO | 2011/073670 | 6/2011 |

OTHER PUBLICATIONS

Wache, "Application of Phasor Measurement Units in Distribution Networks", (CIRED) 22nd International Conference on Electricity Distribution, Paper 0498, Jun. 10-13, 2013, pp. 1-4.
Shi et al., "Identification of Short Transmission-Line Parameters from Synchrophasor Measurements", Power Symposium, 40th North American, IEEE, Sep. 28, 2008, pp. 1-8.

\* cited by examiner

METHOD OF DETERMINING A CONDITION OF AN ELECTRICAL POWER NETWORK AND APPARATUS THEREFOR

FIELD OF THE INVENTION

The present invention relates to a method of determining a condition of a network section comprised in an electrical power network, such as a network section comprised in a distribution network. The present invention also relates to apparatus for determining a condition of a network section comprised in an electrical power network and an electrical power network comprising such apparatus.

BACKGROUND ART

There has been a significant increase over the last decade in the amount of renewable generation capacity connected to electrical distribution networks. In the United Kingdom, for example, many distribution networks are reaching their maximum capacity and are unable to include more renewable generation capacity without making significant investment in network reinforcement to accommodate expected generation capacity increases.

Distribution network operators often follow a 'fit and forget' approach to the assessment of the maximum generated power that can be received by a network from a particular network point. The 'fit and forget' approach amounts to identifying the worst case scenario that could take place over an extended period of time such as a year. The worst case scenario typically involves minimum demand at the same time as maximum generation. Calculation of maximum generated power according to the 'fit and forget' approach is illustrated with reference to FIG. 1. FIG. 1 represents a section of an electrical network 10 comprising a first bus 12 which is connected to the remaining electrical network 14 and a second bus 16 to which a generator 18 and a load 20 are connected. An electrical line 22 between the first and second buses 12, 16 has a rating of 10 MVA which is the maximum amount of apparent power that can be carried by the electrical line without causing a thermal overload. The load 20 at the second bus 16 has an annual minimum value of 2 MVA. The maximum output that can be produced by the generator 18 at the second bus 16 is therefore 12 MVA with 2 MVA of the 12 MVA being consumed locally by the load 20 and the remaining 10 MVA being conveyed over the electrical line 22. Production of more than 12 MVA by the generator 18 will breach the 10 MVA rating of the electrical line 22 and cause a thermal overload. Calculating the maximum generation capacity according to this approach will ensure that there is no violation of the thermal constraint imposed by the electrical line 22 for all different levels of consumption by the local load 20. The 'fit and forget' approach does, however, determine the maximum generation capacity in a conservative fashion. This is because consumption by the local load 20 will be greater than the minimum value most of the time and at such times the generator 18 is capable of producing more than 12 MVA without violating the thermal constraint imposed by the electrical line 22. It has been appreciated that the 'fit and forget' approach to determining maximum generated power is likely to hinder the increase in renewable generation capacity.

Active Network Management (ANM) provides for greater generation capacity to be added to an electrical network than the 'fit and forget' approach. According to the ANM approach the thermal load on the electrical line 22 between the first and second buses 12, 16 in FIG. 1 is monitored. When the thermal load exceeds the rating of the electrical line 22 the generator 18 output is reduced. ANM therefore involves monitoring the electrical network and controlling generation on an on-going basis. ANM offers the advantage of providing for an increase in generation capacity without violating thermal constraints and without requiring network reinforcement, such as by adding a new line of 10 MVA rating in parallel with the existing line 22.

Many approaches to ANM depend on direct measurements being made at every constraint location. Such a known approach normally requires the installation of a large number of measuring devices at a correspondingly high investment cost. A form of ANM which is operable on the basis of indirect measurement is described in WO 2011/073670. According to WO 2011/073670 a first voltage phasor measurement is made at an output from a generator and a second voltage phasor measurement is made at a location within an electrical network to which the generator provides power. A phase angle difference between the first and second voltage phasor measurements is determined. The phase angle difference reflects the impedance of the measured part of the electrical network as well as the surrounding load and generation circumstances. The determined phase angle difference is then compared with a threshold value that represents a constraint on the electrical line between the generator and the electrical network and the generator is controlled in dependence on the outcome of the comparison. The approach of WO 2011/073670 is thus operable with fewer measuring devices than other ANM approaches and thereby saves on investment cost as well as providing for a simplification of control logic required to process and act on measurements.

The present inventors have appreciated that the direct measurement approaches to ANM and the indirect measurement approach of WO 2011/073670 have shortcomings. The present invention has been devised in the light of this appreciation.

It is therefore an object for the present invention to provide a method of determining a condition of a network section comprised in an electrical power network and in particular a method of determining the condition in dependence on indirect measurement of the network section.

It is a further object for the present invention to provide apparatus for determining a condition of a network section comprised in an electrical power network and in particular apparatus for determining the condition in dependence on indirect measurement of the network section.

STATEMENT OF INVENTION

According to a first aspect of the present invention there is provided a method of determining a condition of a network section comprised in an electrical power network, the network section being configured such that electrical power flows to or from each of plural locations in the network section, the method comprising:
  receiving a first quantity in respect of a first location in the network section and receiving a second quantity in respect of a second location in the network section, each of the first and second quantities corresponding to a signal amplitude and a signal phase angle at its respective location; and
  determining a condition quantity corresponding to a loading condition of the network section between the first and second locations in dependence on the first and second quantities.

The network section according to the present invention is configured such that electrical power flows to or from each of plural locations in the network section. For example a generator may provide for electrical power flow to the network section at the first location, a power sink, such as a transmission or distribution line, may provide for electrical power flow from the network section at the second location and an energy storage arrangement at a further location between the first and second locations may provide for electrical power flow to or from the network section depending on whether the energy storage arrangement is operative to release or store energy. The network section may be configured such that a location to or from which there is electrical power flow may be either at the first or second location or between the first and second locations. The condition quantity may correspond to a loading condition of all of the network section between the first and second locations. The condition quantity may thus correspond to a bulk condition quantity of the network section. In use the method according to the present invention comprises receiving a first quantity in respect of the first location and a second quantity in respect of the second location. The first and second locations may be spaced apart from each other. According to the previously provided example the first quantity may be received by way of measurement at the first location and the second quantity may be received by way of measurement at the second location whereby no quantity is received in respect of the further location between the first and second locations where the energy storage arrangement provides for power flow to or from the network section. The method according to the invention is therefore operative according to an indirect measurement approach in common with the approach of WO 2011/073670. Measurements made at the first and second locations according to the present invention may amount to making measurements at fewer than all appropriate locations in the network section, such as at all locations at which there is a constraint, such as a thermal constraint, or at all locations at which electrical power flows to or from the network section. The method according to the present invention may therefore operate with a lower overhead with regards to measurement equipment and data processing compared with direct measurement of power system quantities that determine violation of a constraint.

One known direct measurement approach involves measuring a quantity of interest, such as voltage, at a location of interest. Another known direct measurement approach involves measuring a first quantity, such as current, at a location of interest and calculating a second quantity of interest, such as voltage, at the location of interest on the basis of the measured first quantity. Yet another known direct measurement approach involves measuring first and second quantities, such as voltage, at respective first and second locations and calculating a third quantity, such as voltage, at a location of interest between the first and second locations. The first, second and third quantities may be of the same form, such as voltage, or they may differ with one, for example, being voltage and the other two being current. In contrast indirect measurement involves measuring first and second quantities at respective first and second locations and calculating a third quantity which represents an overall or bulk condition between the first and second locations. The first, second and third quantities may be the same, such as voltage. Alternatively the first, second and third quantities may differ. For example the first and second quantities may be voltage and the third quantity may be another quantity such as current, active power, reactive power, etc. Indirect measurement may therefore comprise determining a bulk condition quantity between measurement locations whereas direct measurement comprises determining a quantity at a specific location.

The method according to the present invention further comprises determining a condition quantity and perhaps more than one condition quantity corresponding to a loading condition of the network section between the first and second locations in dependence on the first and second quantities. A condition quantity may, for example, comprise whether or not a thermal constraint between the first and second locations is being breached, whether or not a voltage constraint between the first and second locations is being breached, or if there has been a change in the configuration of the network section between the first and second locations or a change in the configuration of the surrounding electrical power network which affects a loading condition in the network section between the first and second locations. The condition quantity is determined on the basis of amplitude information and phase angle information whereas the approach according to WO 2011/073670 comprises determining a condition on the basis of phase angle information and without reliance on amplitude information. The method according to the present invention may comprise determining the condition quantity in dependence on complex signals which reflect amplitude and phase information. The method of the present invention may therefore more properly reflect current flow in and out of the network section and perhaps also real and reactive power flow in and out of the network section to thereby provide for better condition quantity determination than, for example, the approach according to WO 2011/073670 which is operative only on a difference in phase angles.

The first and second quantities may be substantially synchronised with each other. The first and second quantities may, for example, be obtained in dependence on substantially synchronous measurements at respective first and second locations, such as by Phasor Measurement Units (PMUs). The signal amplitude and the signal phase angle of at least one of the first and second quantities may be in respect of a same form of signal such as a same form of electrical signal. More specifically the signal amplitude and the signal phase angle of at least one of the first and second quantities may be in respect of a voltage waveform. For example a first quantity may correspond to a voltage waveform measured at a first location, such as by a first PMU, and a second quantity may correspond to a voltage waveform measured at a second location, such as by a second PMU. At least one of the first and second quantities may have the form of or be derived from a phasor measurement, such as a voltage phasor measurement. As will become clear from the following description certain embodiments of the invention may be operative in dependence on one form of signal amplitude and signal phase angle at each of the first and second locations whereas other embodiments of the invention may be operative in dependence on two forms of signal amplitudes and signal phase angles at each of the first and second locations. The two forms of signal amplitudes and signal phase angles may, for example, comprise a first form of signal amplitude and signal phase angle in respect of a voltage waveform and a second form of signal amplitude and signal phase angle in respect of a current waveform.

The condition quantity may be determined in dependence on a difference between a phase angle of the first quantity and a phase angle of the second quantity. In addition the condition quantity may be determined in dependence on an amplitude of the first quantity and an amplitude of the second quantity.

The network section may be configured such that there is at least one network node between the first and second locations. There may, for example, be a first transmission line of higher rating, such as of 22 MVA, at one side of a network node and a second transmission line of lower rating, such as of 10 MVA, at the other side of the network node whereby the second transmission line imposes a constraint on operation of the network section between the first and second locations. A network node may comprise the like of a bus or may comprise apparatus, such as generation or energy storage apparatus as described further below.

The method according to the present invention may be applied to advantageous effect where an electrical characteristic of the network section between the first and second locations changes over time. At least one equivalent impedance of the network section between the first and second locations, such as an equivalent series impedance and an equivalent shunt impedance which model the electrical characteristics, may thus change over time, e.g. as a consequence of changes to the network section or changes to the wider electrical power network which affect the loading conditions of the network section. As described above the network section may be configured such that electrical power flows to or from the network section between the first and second locations. More specifically, the network section may be configured such that there is at least one electrical power flow and perhaps many electrical power flows to or from the network section between the first and second locations with such power flows not being measured directly.

Electrical power flows to and from the network section may be caused by an electrical arrangement which is operative to at least one of source electrical energy to or sink electrical energy from the network section. The electrical arrangement may comprise at least one transmission or distribution line, which is operative to convey electrical power to or from the network section. Alternatively or in addition the electrical arrangement may comprise electrical apparatus, such as load apparatus, a generator or energy storage apparatus, which is electrically coupled to the network section. The electrical apparatus may comprise energy conversion apparatus which is operative to convert between electrical energy and another form of energy, such as electrochemical energy where the electrical apparatus is energy storage apparatus in the form of a battery or such as kinetic energy where the electrical apparatus is a pumped storage arrangement. The electrical apparatus may be dynamic apparatus which is characterised by change over time in respect of an extent of at least one of a level of power sunk from or power sourced to the network section. The electrical power network may comprise such an electrical arrangement. According to a simple configuration of network section electrical power may flow into the network section at the first location, e.g. from a first, local generator, flow from the network section at the second location, e.g. into a bulk power receiving point, and flow into the network section at a third, further location between the first and second locations at an electrical connection to a second generator. The electrical power network may, of course, comprise many transmission or distribution lines and many electrical apparatus which provide for a complex and changing pattern of power flow to and from the network section.

The electrical characteristics of a network section between the first and second locations may be approximated. The electrical characteristics of the network section may be represented by an equivalent electrical model of the network section between the first and second locations. The electrical model may be an approximate representation of the network section between the first and second locations. The electrical model may represent the actual electrical characteristics of the network section sufficiently closely to provide for determination of a condition quantity of practical utility. Determining a condition quantity according to the present invention may therefore comprise determining the condition quantity in dependence on an electrical model of the network section between the first and second locations. The electrical model may comprise a series impedance between the first and second locations. In addition the electrical model may comprise at least one shunt impedance between the series impedance and a reference potential, such as earth potential. More specifically the electrical model may comprise a first shunt impedance between a first end of the series impedance and the reference potential and a second shunt impedance between a second opposite end of the series impedance and the reference potential. The electrical model is described further below with reference to embodiments of the present invention.

The network section may have a radial configuration. Radial configurations are often used in distribution networks on account of their low cost, which arises from a requirement for fewer conductors and simple line protection methods, and the ease with which their configuration may be changed such as by addition of renewable energy generation capacity. The connection of renewable generation capacity to distribution networks is a form of configuration change which has been seen with increasing frequency in recent years. The electrical power network may therefore comprise a distribution network with the network section being comprised in the distribution network. The present invention may be applied in electrical power networks other than distribution networks. For example the condition of a network section in a primary transmission network, e.g. where a generating point is connected to a bulk receiving point, may merit determination. The electrical power network may therefore comprise a primary transmission network with the network section being comprised in the primary transmission network. By way of further example the condition of a network section in a sub-transmission network, e.g. where a bulk power receiving point is connected to an area substation, may merit determination. The electrical power network may therefore comprise a sub-transmission network with the network section being comprised in the sub-transmission network.

The method may comprise determining a condition quantity of the network section on a periodic basis. The method may therefore comprise receiving the first and second quantities on a periodic basis. The condition quantity of the network section may be determined at a period of less than substantially 20 seconds, 10 seconds, 5 seconds, 1 second, 0.5 seconds, 0.25 seconds, 0.1 seconds, 0.05 seconds, 0.02 seconds or 0.01 seconds.

As mentioned above the present invention may comprise determining different condition quantities. Embodiments of the present invention which are operative to provide for determination of different condition quantities will now be described.

As described above, following a 'fit and forget' approach to address thermal constraints in an electrical power network may involve operating the electrical power network such that its power conveying capacity is not properly utilised. Known approaches to ANM involving direct measurements being made at every constraint location often provide for an improvement in power conveying capacity but at a high investment cost. The present invention, on the other hand, may address thermal constraints whilst improving use of power conveying capacity and without high investment cost. Determining a condition of a network section according to the present invention may therefore comprise determining whether or not a thermal constraint is being violated and may thereby allow for control of the electrical power network to either increase or decrease electrical power conveyed by the network section.

According to an embodiment of the present invention determining a condition of the network section may comprise determining a loading quantity for the network section in dependence on the first and second quantities. More specifically the loading quantity may be determined in dependence on a difference between first and second signal amplitudes and a difference between first and second signal phase angles. The first and second signal amplitudes may be one of voltage and current amplitudes. The first and second signal phase angles may be one of voltage and current phase angles. The use of first and second voltage amplitudes and phase angles may be preferred to first and second current amplitudes and phase angles on account of voltage waveforms being more readily measured or more readily available than current waveforms. The loading quantity may be determined in dependence on a complex calculation comprising the first and second signal amplitudes and the difference between the first and second signal phase angles. The loading quantity may be calculated by way of:

$$|S_{trim}| \angle \delta_{trim} = |V_s|^2 - |V_s||V_r|(\cos(\theta) + i*\sin(\theta))$$

where $|S_{trim}| \angle \delta_{trim}$ is the loading quantity, $|V_s|$ is the voltage amplitude at the first location, $|V_r|$ is the voltage amplitude at the second location, and $\theta$ is the difference between the voltage phase angles at the first and second locations, i.e. $\delta_s - \delta_r$. The present equation for loading quantity determination may reflect power flow in one direction, i.e. from the first location to the second location, where the loading quantity is positive. A negative loading quantity may, on the other hand, reflect power flow in the opposite direction. Alternatively the present equation may reflect power flow in the opposite direction, i.e. from the second location to the first location, by replacing the instances of $|V_s|$ with $|V_r|$, replacing the instance of $|V_r|$ with $|V_s|$ and by determining the phase angle difference on the basis of $\delta_r - \delta_s$ such that a positive loading quantity is obtained.

Where voltage and current signal amplitudes and phase angles are available instead of, for example, only voltage signal amplitudes and phase angles, the loading quantity may be determined more properly. Each of the first and second quantities may therefore comprise a voltage quantity which corresponds to a voltage amplitude and voltage phase angle and a current quantity which corresponds to a current amplitude and phase angle. The loading quantity may be determined as described above and also in dependence on an impedance and more specifically a series impedance between the first and second locations. The series impedance may be determined in dependence on the voltage and current quantities of the first and second quantities. The series impedance may be determined on a periodic basis. More specifically the series impedance may be determined at a period which is the same as a period at which the loading quantity is determined. The complex series impedance may be calculated by way of:

$$Z_{eq} = \left(V_s - V_r \times \frac{I_s V_s + I_r V_r}{I_s V_r + I_r V_s}\right) / I_r$$

where $Z_{eq}$ is the series impedance, $V_s$ is the voltage phasor at the first location, $V_r$ is the voltage phasor at the second location, $I_s$ is the current phasor at the first location and $I_r$ is the current phasor at the second location.

When dependent on the series impedance the loading quantity may be calculated by way of:

$$|S| \angle \delta = \frac{|V_s|^2 - |V_s||V_r|(\cos(\theta) + i*\sin(\theta))}{Z_{eq}}$$

where $|S| \angle \delta$ is the loading quantity, $|V_s|$ is the voltage amplitude at the first location, $|V_r|$ is the voltage amplitude at the second location, $\theta$ is the difference between the voltage phase angles at the first and second locations, i.e. $\delta_s - \delta_r$, and $Z_{eq}$ is the complex series impedance. As described above with respect to series impedance independent calculation of loading quantity, the series impedance dependent calculation of loading quantity may reflect power flow in the opposite direction where the loading quantity is negative or by rearranging the above equation to provide a positive loading quantity.

The loading quantity may not reflect thermal flow in any particular part of the network section but instead may reflect the overall thermal flow and hence thermal loading in the network section between the first and second locations. As mentioned above determining a condition of a network section may comprise determining whether or not a thermal constraint is being violated. Determining whether or not a thermal constraint is being violated may comprise comparing a determined loading quantity with a predetermined loading quantity. The method may comprise determining a constraint violation in the network section if the determined loading quantity is greater than the predetermined loading quantity. Alternatively the method may comprise determining a lack of constraint violation in the network section if the determined loading quantity is smaller than the predetermined loading quantity.

The electrical power network may be controlled depending on whether or not there is a thermal constraint violation. For example the loading quantity may be increased, for example by increasing generation at the first location, if there is no thermal constraint violation whereby better use may be made of the capacity of the network section. By way of another example the loading quantity may be decreased, for example by decreasing generation at the first location, if there is a thermal constraint violation whereby the integrity of the network section may be maintained. The method may therefore further comprise controlling the electrical power network in dependence on a comparison of a determined loading quantity with a predetermined loading quantity. Control may comprise at least one of control of generation and loading in apparatus comprised in the electrical power network. Control may comprise maintaining the determined loading quantity less than or equal to the predetermined loading quantity.

The present invention may provide for more sophisticated control approaches which provide for improved utilisation of electrical assets comprised in the electrical power network. A voltage within an electrical power network may be regulated by changing the real power output or the reactive power output of a generator. From an economic perspective it is often preferable to change reactive power generation before real power generation is changed. There are, however, limits to the extent to which reactive power can be changed. More specifically the reactive power capacity of a generator imposes one limit. Another limit is imposed by increased reactive power causing a thermal constraint violation in the electrical power network. When one of these limits is reached the generator may be controlled in respect of its real power generation instead of reactive power generation. Thus the more economically attractive approach of reactive power generation control may be used in preference to the less economically attractive approach of real power generation control. The method according to the present invention may therefore further comprise determining whether or not there is a voltage limit violation in the electrical power network and more specifically in the network section. More specifically there may be a voltage limit violation where a voltage amplitude at at least one of the first location and the second location exceeds a predetermined value. Alternatively or in addition the method may further comprise determining whether or not a loading quantity amplitude exceeds a predetermined loading quantity amplitude. Where there is no voltage limit violation and where the loading quantity amplitude does not exceed the predetermined loading quantity amplitude there may be no control or change in control of the electrical power network. Alternatively or in addition and where there is a voltage limit violation, the method may be further operative to control the reactive power output of apparatus, such as a generator, comprised in the electrical power network. More specifically the method may comprise controlling the reactive power output to decrease an angle of the loading quantity. In addition the method may be further operative to determine whether or not the loading quantity amplitude exceeds the predetermined loading quantity amplitude and whether or not the reactive power capacity is exceeded. If either the loading quantity amplitude exceeds the predetermined loading quantity amplitude or the reactive power capacity is exceeded, the method may be operative to control real power output of apparatus, such as a generator, comprised in the electrical power network. Alternatively or in addition and where the loading quantity amplitude exceeds the predetermined loading quantity amplitude, the method may be further operative to control the reactive power. More specifically the method may comprise controlling the reactive power output to move an angle of the loading quantity towards zero. In addition the method may be further operative to determine whether or not there is a voltage limit violation and whether or not the reactive power capacity is exceeded. If there is a voltage limit violation or the reactive power capacity is exceeded, the method may be operative to control real power output of apparatus, such as a generator, comprised in the electrical power network.

The method may be further operative to compare a determined loading quantity with a predetermined loading quantity, as described above in more detail, to determine whether or not there is a thermal constraint violation. Where no thermal constraint violation is determined in dependence on the comparison the method may be further operative to control reactive power output of apparatus, such as a generator, comprised in the electrical power network. Alternatively or in addition and where a thermal constraint violation is determined in dependence on the comparison the method may be further operative to control real power output of apparatus, such as a generator, comprised in the electrical power network.

As described above determination of a condition of the network section, such as whether or not there is a thermal constraint violation, may comprise comparing a determined loading quantity with a predetermined loading quantity. The predetermined loading quantity may reflect a constraint, such as a thermal constraint, in the network section. A network section may be subject to plural constraints. Where a network section is subject to plural constraints the predetermined loading quantity may be a critical predetermined loading quantity, i.e. the predetermined loading quantity corresponding to the most limiting of the plural constraints. Irrespective of whether a network section is subject to one or more constraints, a characteristic of a constraint as reflected in a predetermined loading quantity may depend on operating circumstances of the network section. For example constraint characteristics may depend on the like of extent of generation versus extent of loading. It may therefore be necessary to analyse the response of the network section under at least one operating circumstance to identify and quantify at least one constraint. The response of the network section may be analysed by modelling the network section and perhaps also the surrounding electrical power network. The method of the present invention may therefore comprise forming a model of the network section and perhaps also the surrounding electrical power network. Such a model may be of a form appropriate for machine based storage and operation, such as in computing apparatus. The method may comprise changing an operating circumstance of the model, such as changing at least one of loading and generation, until a constraint violation occurs. More specifically at least one of loading and generation may be increased progressively until a constraint violation occurs. Where there are plural changes of operating circumstances that may arise in the real electrical power network, each of the plural operating circumstances may be changed in the model until each of the respective constraint violations occurs. As mentioned above the network section may be subject to plural constraints. The method may therefore comprise for each of plural constraints changing an operating circumstance of the model until a respective constraint violation occurs. A constraint may be: a thermal constraint; a voltage rise constraint; a reverse power flow constraint; a transient stability limit; a voltage stability limit; and an oscillation stability limit.

When a modelled constraint violation occurs the method may comprise determining the predetermined loading quantity. More specifically the predetermined loading quantity may be determined in dependence on the first and second quantities which provide for the constraint violation. For example the first and second quantities may correspond to the voltage and current amplitudes and phase angles at a respective of one the first and second locations. More specifically the predetermined loading quantity may be calculated by way of one of the two loading quantity equations described above with the series impedance loading quantity equation providing for more proper determination of the predetermined loading quantity. Where modelling yields a plurality of constraint violations a predetermined loading quantity may be determined in respect of each of the plurality of constraint violations. In addition the method may comprise comparing the plurality of predetermined loading quantities to determine the most restrictive predetermined loading quantity, such as a minimum predetermined loading quantity where a thermal limit is of concern. The most restrictive predetermined loading quantity may constitute a critical predetermined loading quantity.

The voltage signal at one of the first and second locations may exceed regulatory limits on account of a loading condition of the network section. The location where the voltage signal exceeds regulatory limits may, for example, be a feeder point where local generation is connected to the electrical power network. When the voltage signal at the location exceeds regulatory limits a known practice is to control a transformer comprised in the electrical power network, such as a transformer where the network section connects to the bulk electrical network. More specifically the transformer is controlled by changing its tap position and thereby the transformer ratio to change the voltage signal on the low side, i.e. network section side, of the transformer. The required transformer tap position is determined on the basis of a target voltage signal at the network section side of the transformer which is required to bring the regulatory limit exceeding voltage signal within limit. According to known approaches a target voltage signal and a required change in transformer ratio or target transformer ratio are determined by modelling the electrical power network on a detailed basis which takes account of voltage signals on all buses within the part of the electrical power network of interest. Such known approaches thus involve modelling in respect of all constraint locations. In contrast the present invention may provide for an indirect and hence simpler approach to transformer tap position determination. The method of the present invention may therefore further comprise determining a tap position or ratio of a transformer which is comprised in the electrical power network. The transformer may be electrically coupled to the network section. The method of the present invention may comprise determining at least one of: a target voltage signal at the second location; and a target transformer ratio for a transformer which is electrically coupled to the second location. The second location may be electrically connected to the transformer and more specifically to one side of the transformer, for example to a controlled side of the transformer, such as to a low voltage side of the transformer where the network section is comprised in a distribution network.

Irrespective of whether the target voltage signal or the target transformer ratio is determined, the method may be operative in dependence on voltage signals measured at the first and second locations in the network section, namely the second location and the first location which is subject to a voltage signal limit. It may thus be appreciated that making such a determination is dependent on a condition of the network section as reflected by the voltage signals measured at the two locations in the network section. The method of the present invention may therefore be operative on an indirect measurement basis in contrast to known approaches which require more detailed modelling that relies on direct measurement at every constraint location. More specifically the method may further comprise determining the target voltage signal or the target transformer ratio in dependence on a received second quantity corresponding to a voltage signal amplitude and a voltage signal phase at the second location and on a received first quantity corresponding to a voltage signal amplitude and a voltage signal phase at the first location, the first location being subject to a voltage signal limit. More specifically the target voltage signal may be determined in dependence also on a target first location voltage signal, the target first location voltage signal being within the voltage signal limit.

Where the method comprises determining the target voltage signal, the target voltage signal may be calculated by way of:

$$V_{r\_new} = \frac{V_{ref} \pm \sqrt{V_{ref}^2 - 4V_r(V_s - V_r)}}{2}$$

where $V_{r\_new}$ is the target voltage signal, $V_{ref}$ is the target first location voltage signal, $V_r$ is a voltage phasor corresponding to a voltage signal amplitude and a voltage signal phase at the second location and $V_s$ is a voltage phasor corresponding to a voltage signal amplitude and a voltage signal phase at the first location. Where the method comprises determining the target transformer ratio, the target transformer ratio may be calculated by way of:

$$\text{ratio} = \frac{V_{ref} \pm \sqrt{V_{ref}^2 - 4V_r(V_s - V_r)}}{2V_r}$$

where ratio is the target transformer ratio and the other components of the equation are as per the immediately preceding equation. The method may further comprise determining the target voltage signal in dependence on the determined transformer ratio and a voltage signal corresponding to a voltage signal amplitude and a voltage signal phase at the second location and more specifically by calculation of: $V_{r\_new} = V_r \times \text{ratio}$.

Where the present tap position, $t_{old}$, for the transformer is known a new position for the transformer may be determined in dependence on the present tap position and either the target transformer ratio or the target voltage signal. More specifically the present tap position may be calculated by way of: $t_{new} = t_{old} \times \text{ratio}$.

The method may further comprise controlling the electrical power network in dependence on a determination, such as a target transformer ratio, made in respect of a voltage signal limit. More specifically controlling the electrical power network may comprise controlling a transformer, such as by changing the transformer tap position. Following control of the electrical power network the method may further comprise making a further determination in respect of the voltage signal limit. Such a further determination may provide for confirmation of proper operation of the electrical power network or may provide for improved control of the electrical power network with respect to the voltage signal limit.

The present inventors have appreciated that a change in a condition determined in accordance with the present invention may provide for detection of a change in the network section. Such a change may reflect a circumstance that merits investigation or perhaps even intervention. For example a malfunction of electrical apparatus comprised in the electrical power network may cause a large change in power sourced from or sunk to the network section and thus change a loading condition between the first and second locations. A large change in power sourced from or sunk to the network section is liable to cause a change in the loading condition of the network section which may be detectable by way of the present invention and thereby allow for investigation and perhaps also intervention. By way of another example a transmission line between the first and second locations in the network section may trip and thereby cause a change in the loading condition between the first and second locations. The method may therefore further comprise determining a change in a loading condition of the network section. In addition the method may comprise determining whether or not the determined change is sufficient to generate an indication, e.g. to a user of the invention. More specifically the method may comprise comparing the loading condition with a reference and generating an indication if the loading condition is greater than the reference.

The method may comprise determining the condition quantity over time. The method may comprise comparing the condition quantity with a reference quantity. The reference quantity may be determined by way of off-line studies. The comparison may provide for detection of a change in condition of sufficient extent that, for example, warrants intervention. The condition quantity may comprise an impedance. The received first and second quantities may each correspond to a voltage signal amplitude and phase angle. Alternatively or in addition, the received first and second quantities may each correspond to a current signal amplitude and phase angle. The impedance may be a series impedance between the first and second locations. The impedance may be determined in dependence on: voltage signal amplitudes and phase angles at the first and second locations; and current signal amplitudes and phase angles at the first and second locations. More specifically the series impedance may be determined in dependence on: a difference between the voltage signal amplitude and phase angle at one of the two locations and the voltage signal amplitude and phase angle at the other of the two locations; one of the current signal amplitude and phase angle at the first location and the current signal amplitude and phase angle at the second location. The series impedance may be further determined in dependence on a ratio of voltage and current signal amplitudes and phase angles at the first and second locations. The series impedance, $Z_{eq}$, may be calculated by way of the equation specified above.

The electrical power network may be controlled depending on the determination of a change in a loading condition of the network section, such as a change which is determined as meriting intervention. The electrical power network may be controlled according to the approaches described above. More specifically and by way of example the electrical power network may be controlled in accordance with a more conservative approach which reduces the likelihood of tripping of one or more transmission lines in the network section.

At least one of the first and second quantities may be received by way of processing apparatus from measurement apparatus, such as at least one phasor measurement unit (PMU). More specifically measurements may be received from the measurement apparatus in processing apparatus which is operative to provide at least one of the first and second quantities. Furthermore the processing apparatus may be operative to determine at least one of signal amplitude and signal phase angle in dependence on measurements received from the measurement apparatus. Alternatively at least one of the first and second quantities may be received having been determined by processing apparatus which is operated in a territory or jurisdiction other than the territory or jurisdiction in which the present invention is used. For example and where the electrical power network spans more than one jurisdiction at least one of the first and second quantities may be received, e.g. in electronic form, from an operating company in another jurisdiction. Alternatively at least one of the first and second quantities may be determined by processing apparatus which is operated by a first operator, such as an operating company, and then conveyed to a second operator, such as an analysis company. The measurement apparatus may be configured to make measurements at locations in the network section. More specifically each of the first and second quantities may be received by way of processing apparatus from a respective phasor measurement unit. The phasor measurement units may be temporally synchronised with each other.

The steps of receiving the first and second quantities and determining a condition quantity may be performed in computer apparatus or the like. The steps of receiving the first and second quantities and determining a condition quantity may therefore be performed by electronic means. The first and second quantities may be received in computer apparatus or the like before the step of determining a condition of the network section is performed. At least one of the first and second quantities may be received in a machine readable format.

According to a second aspect of the present invention there is provided a computer program comprising program instructions for causing a computer to perform the method according to the first aspect of the present invention.

More specifically the computer program may be one of: embodied on a record medium; embodied in a read only memory; stored in a computer memory; and carried on an electrical carrier signal. Further embodiments of the second aspect of the present invention may comprise one or more features of the first aspect of the present invention.

According to a third aspect of the present invention there is provided a computer system comprising program instructions for causing a computer to perform the method according to the first aspect of the present invention.

More specifically the program instructions may be at least one of: embodied on a record medium; embodied in a read only memory; stored in a computer memory; and carried on an electrical carrier signal. Further embodiments of the third aspect of the present invention may comprise one or more features of the first aspect of the present invention.

According to a fourth aspect of the present invention there is provided apparatus for determining a condition of a network section comprised in an electrical power network, the network section being configured such that electrical power flows to or from each of plural locations in the network section, the apparatus being configured to receive a first quantity in respect of a first location in the network section and to receive a second quantity in respect of a second location in the network section, each of the first and second quantities corresponding to a signal amplitude and a signal phase angle at its respective location, and the apparatus comprising a processor which is operative to determine a condition quantity corresponding to a loading condition of the network section between the first and second locations in dependence on the first and second quantities.

The apparatus may further comprise at least one of: a first measurement unit, such as a PMU, operative to provide measurements at a first location for the first quantity; and a second measurement unit, such as a PMU, operative to provide measurements at a second location for the second quantity. At least one of the first and second measurement units may be in signal communication with the processor, for example, by way of a copper, optical fibre or wireless link, whereby the processor may receive measurements from a measurement unit. The processor may be operative to provide at least one of the first and second quantities in dependence on received measurements. More specifically the processor may be operative to receive raw measurements, for example in the form of voltage phasor measurements, and to provide in dependence on the received measurements first and second quantities as described above with reference to the first aspect of the present invention, such as voltage or current amplitudes and voltage or current phase angles. The processor may, for example, comprise a Wide Area Monitoring System (WAMS), which is operative on the raw measurements.

Alternatively or in addition the apparatus may comprise output apparatus operable to provide an output to a user. More specifically the output apparatus may be operable to provide to the user a condition of the network section, such as information relating to a constraint violation, information relating to a required transformer tap change or information relating to a change in condition of the network section that warrants intervention with regards to the electrical power network. Further embodiments of the fourth aspect of the present invention may comprise one or more features of any previous aspect of the present invention.

According to a fifth aspect of the present invention there is provided an electrical power network, such as an electrical grid, comprising a network section and apparatus according to the fourth aspect of the present invention. Embodiments of the fifth aspect of the present invention may further comprise one or more features of any previous aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
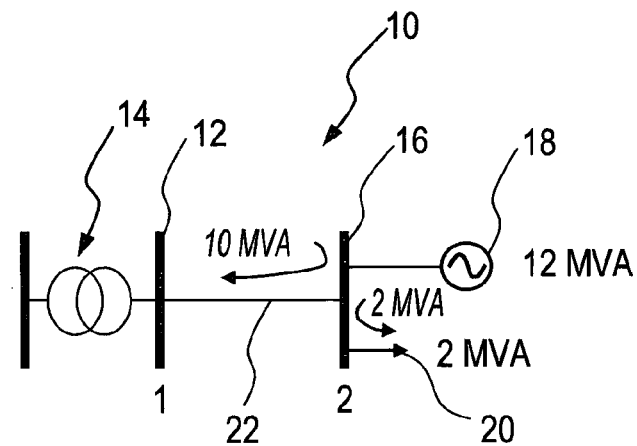
FIG. 1 represents a section of an electrical network subject to network management according to a known approach.

A section of an electrical network subject to network management according to a known approach is represented in FIG. 1. FIG. 1 is described above as background art.

Figure 2:
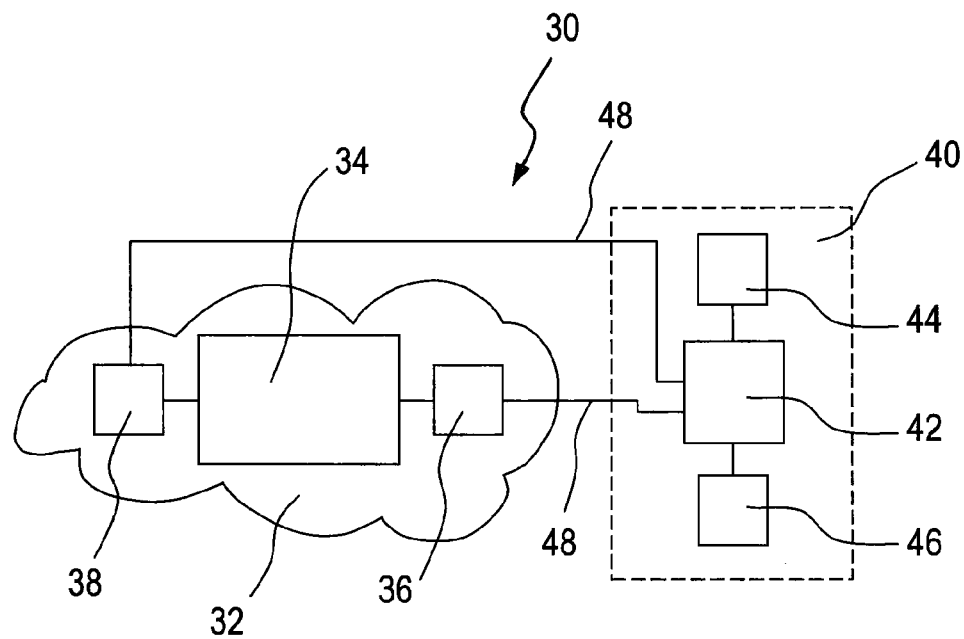
FIG. 2 is a block diagram representation of apparatus according to the present invention.

A block diagram representation of apparatus 30 according to the present invention is shown in FIG. 2. The apparatus 30 comprises an electrical power network 32 which for the purposes of the present description is a distribution network operative at power distribution levels, for example below 132 kV such as 11 kV or 33 kV. The electrical power network 32 comprises a network section 34. The network section 34 and the surrounding electrical power network 32 are described in further detail below with reference to FIG. 3A. A first Phasor Measurement Unit (PMU) 36 is operative to make voltage phasor and current phasor measurements at or near a first location at a boundary of the network section 34 and a second PMU 38 is operative to make voltage phasor and current phasor measurements at or near a second location at the boundary of the network section. Each of the PMUs is compliant with the IEEE C37 standard such as an Alstom P847 from Alstom Grid of St. Leonards Avenue, ST17 4LX, Stafford, United Kingdom. The PMUs are synchronised with one another either of themselves or by way of an external time reference, such as from a GPS time source. The apparatus further comprises computing apparatus 40, which in turn comprises a processor 42, data storage 44 and an output device 46. The computing apparatus 40 and its components will be of a form and function familiar to the skilled reader. The output device 46 of the computing apparatus 40 is operative under control of the processor 42 to display data to a user of the computing apparatus 40. The computing apparatus 40 is operative to receive measurements made by the first and second PMUs 36, 38. Measurements are received by the computing apparatus 40 by way of a communications channel 48 between the computing apparatus 40 and each PMU with the communications channels 48 being of a copper, optical fibre or wireless form.

Operation of the apparatus 30 of FIG. 2 will be described below. In the meantime the network section 34 and surrounding electrical power network 32 will be described in more detail with reference to FIG. 3A. The network section 34 comprises a first bus 52, a second bus 54, a third bus 56 and a fourth bus 58. The surrounding electrical power network 32 comprises a renewable energy generator 64 and a local load 66 which are each connected to the fourth bus 58. The first PMU 36 is operative to measure the current phasor $I_s$ in the line between the third and fourth buses 56, 58 and the voltage phasor $V_s$ on the fourth bus 58 at or near where the renewable energy generator 64 and the local load 66 connect to the fourth bus 58. The points of connection of the renewable energy generator 64 and the local load 66 constitute a first location on the boundary of the network section 34. The surrounding electrical power network 32 further comprises a step-up transformer 60 which is connected at its high voltage side to the sub-transmission system 62 and is connected at its low voltage side to the first bus 52 to thereby establish a bulk power receiving point. The second PMU 38 is operative to measure the current phasor $I_r$ in the line between the first and second buses 52, 54 and the voltage phasor $V_r$ on the first bus at or near the bulk connection point at a second location which is on the boundary of the network section 34. Each of the first to fourth buses 52, 54, 56, 58 is connected to a distribution line which is operative to convey electrical power. The distribution lines between the first and fourth buses 52, 54, 56, 58 are operative to convey power within the network section 34. A further generator 70 is connected to the second bus 54.

Figure 3A:
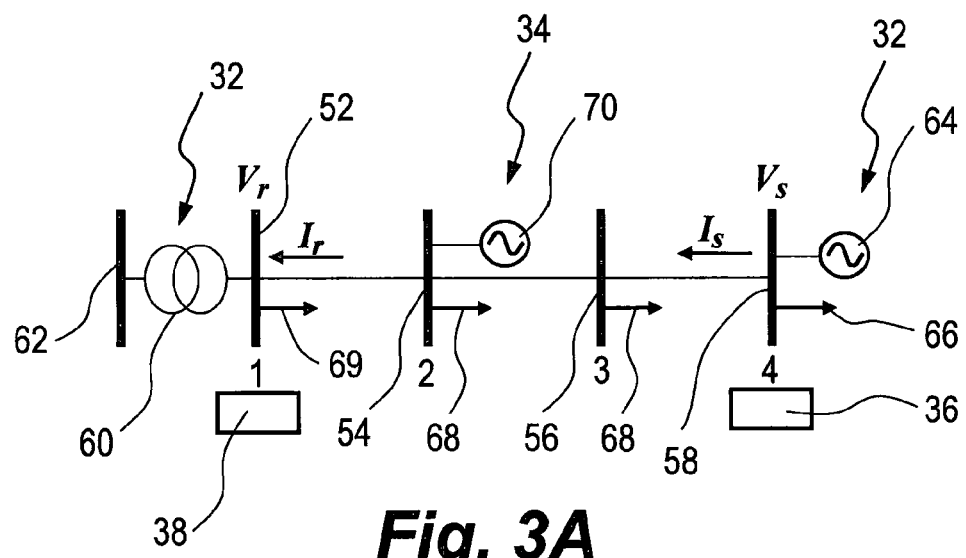
FIG. 3A is a representation of a network section and surrounding electrical power network according to the present invention.
Figure 3B:
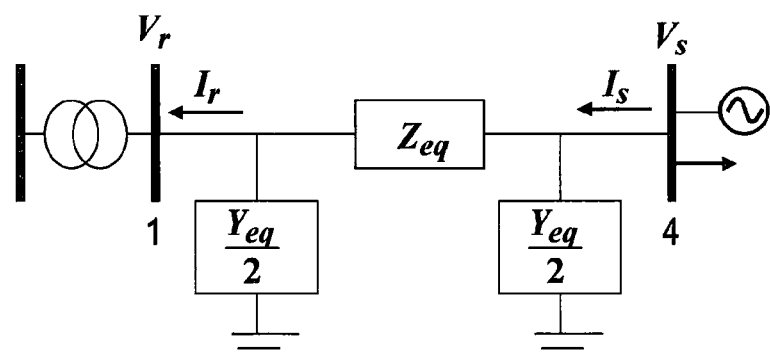
FIG. 3B shows an electrical model of the network section and surrounding electrical power network shown in FIG. 3A.

A network section such as the network section 34 of FIG. 3A can be treated as a transmission line model consisting of a series impedance $Z_{eq}$ between the first bus 52 and the fourth bus 58, a first shunt impedance $$\frac{Y_{eq}}{2}$$

between the first bus and ground and a second shunt impedance $$\frac{Y_{eq}}{2}$$

between the second bus and ground. An electrical model constituted by the series impedance and the two shunt impedances is represented in FIG. 3B. The complex series impedance $Z_{eq}$ is given by:

$$Z_{eq} = \left(V_s - V_r \times \frac{I_s V_s + I_r V_r}{I_s V_r + I_r V_s}\right) / I_r$$

and the complex shunt impedance $Y_{eq}$ is given by:

$$Y_{eq} = \left(2 \times \frac{I_s V_s + I_r V_r}{I_s V_r + I_r V_s} - 2\right) / Z_{eq}$$

where $V_s$ is the voltage phasor (or complex voltage signal) at the first location (i.e. at the fourth bus), $V_r$ is the voltage phasor at the second location (i.e. at the first bus), $I_s$ is the current phasor (or complex current signal) at the first location and $I_r$ is the current phasor at the second location.

Although the electrical model comprises two shunt impedances the present invention makes no use of them and relies on the series impedance, as will become apparent from the following description.

Figure 4:
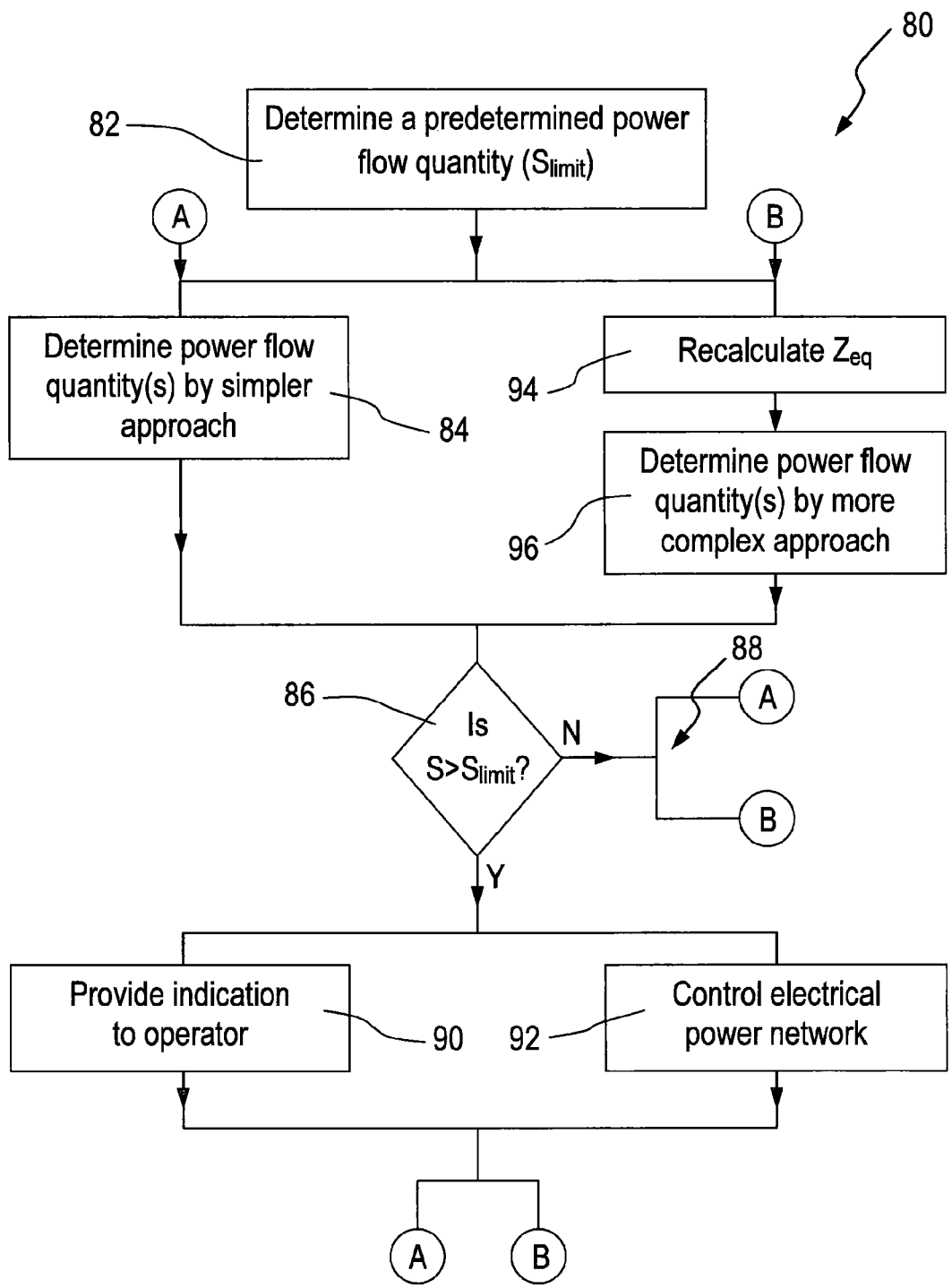
FIG. 4 is a flow chart representation of a method according to a first embodiment of the present invention.

A method according to a first embodiment of the present invention will now be described with reference to FIG. 4 which provides a flow chart representation 80 of steps involved in the method. The first embodiment involves determining on the basis of measurements made by the first and second PMUs 36, 38 whether or not a constraint comprised in the network section 34, such as a thermal constraint, is violated during operation of the electrical power network. A preliminary step of the first embodiment involves determining a limit imposed by a network section constraint. According to the first embodiment the limit imposed by the network section constraint is determined in the form of a predetermined loading quantity 82 or a critical predetermined loading quantity where the network section is subject to more than one constraint.

The predetermined loading quantity is determined by way of modelling or simulation of the network section and the surrounding electrical power network. Worst-case network loading and generation conditions are determined and then modelled. A worst case scenario may, for example, be maximum generation with minimum load. The model is then used to determine the circumstances under which a constraint violation occurs. According to a first approach and when a constraint violation occurs, the voltage waveforms at the first and second locations on the boundary of the model of the network section are determined. Then the predetermined loading quantity is calculated by way of:

$$|S_{limit}| \angle \delta_{limit} = |V_s|^2 - |V_s||V_r|(\cos(\theta) + i * \sin(\theta))$$

where $|S_{limit}| \angle \delta_{limit}$ is the predetermined loading quantity, $|V_s|$ is the voltage amplitude at a first location of the two locations, $|V_r|$ is the voltage amplitude at a second of the two locations, and $\theta$ is the difference between the voltage phase angles at the first and second locations, i.e. $\delta_s - \delta_r$. According to a second approach and when a constraint violation occurs, the voltage and current waveforms at the first and second locations on the boundary of the model of the network section are determined. Then the predetermined loading quantity is calculated by way of:

$$|S_{limit}| \angle \delta_{limit} = \frac{|V_s|^2 - |V_s||V_r|(\cos(\theta) + i * \sin(\theta))}{Z_{eq}}$$

where $|S_{limit}| \angle \delta_{limit}$ is the predetermined loading quantity, $|V_s|$ is the voltage amplitude at a first location of the two locations, $|V_r|$ is the voltage amplitude at a second of the two locations, $\theta$ is the difference between the voltage phase angles at the first and second locations, i.e. $\delta_s - \delta_r$, and $Z_{eq}$ is the complex series impedance between the two locations as calculated by the equation specified above. Of the two approaches the second, series impedance dependent approach yields a better modelled predetermined loading quantity.

The constraint violation modelling process is repeated for each of plural different network loading and generation scenarios to provide a constraint violation for each scenario. The voltage phasors and optionally current phasors at the two locations on the boundary of the model of the network section are applied to one of the two predetermined loading quantity equations specified above to provide plural predetermined loading quantities. Then the most limiting of the plural predetermined loading quantities is identified as the critical predetermined loading quantity by comparing predetermined loading quantities. The network section may be subject to one or more constraints. Constraints include: a thermal constraint; a voltage rise constraint; a transformer reverse power flow constraint; a transient stability limit; a voltage stability limit; and an oscillation stability limit. The network section may be subject to more than one constraint of a particular type at different locations and/or plural constraints of different types. Where the network section is subject to plural constraints the constraint violation modelling process is repeated for each constraint. Each of all the constraints is translated into an equivalent loading quantity. For example, where a constraint is a voltage constraint it is translated into an equivalent loading quantity and where a constraint is a thermal constraint it is translated into an equivalent loading quantity. Then the most conservative of the plural predetermined loading quantities is identified as the critical predetermined loading quantity.

The method of the first embodiment then progresses to monitoring the network section for a constraint violation. There are two alternative approaches according to the embodiment for monitoring for constraint violation: a first simpler approach which provides for less accurate monitoring; and a second more complex approach which provides for more accurate monitoring. According to the first approach a loading quantity is determined for the network section on the basis of voltage phasor measurements only 84, i.e. without relying on current phasor measurements. The first approach is appropriate, for example, where the PMUs provide only voltage phasor measurements or where only voltage phasor measurements or voltage phasor measurement information is received by the operator performing the monitoring process from, for example, the operator of the electrical power network. The loading quantity according to the first approach is determined by way of:

$$|S_{trim}| \angle \delta_{trim} = |V_s|^2 - |V_s||V_r|(\cos(\theta) + i * \sin(\theta))$$

where $|S_{trim}|\angle\delta_{trim}$ is the loading quantity, $|V_s|$ is the voltage amplitude at the first location, $|V_r|$ is the voltage amplitude at the second location, and $\theta$ is the difference between the voltage phase angles at the first and second locations, i.e. $\delta_s-\delta_r$. The voltage amplitudes and phase angles are determined from the voltage phasor measurements. The next step comprises comparing the determined loading quantity with the predetermined loading quantity 86. If the determined loading quantity is less than or equal to the predetermined loading quantity there is no constraint violation and no indication is provided to the operator and no rectifying action is taken 88. On the other hand if the determined loading quantity is greater than the predetermined loading quantity there is a constraint violation and at least one of: an indication of constraint violation is provided to the operator 90; and rectifying action to control the electrical power network to bring the loading quantity within limit. Control of the electrical power network is described below in more detail with reference to FIG. 6. The steps of determining the loading quantity and comparing the determined loading quantity with the predetermined loading quantity are repeated at an appropriate interval, such as once every second.

According to the second approach the next step is recalculation of the series impedance on the basis of fresh voltage and current phasor measurements 94. As will be appreciated from the equation for the series impedance which is specified below with reference to step 96 in FIG. 4, the series impedance is liable to change when there is a change in the network section loading or generation conditions. The series impedance is therefore recalculated on the basis of fresh voltage and current phasor measurements before each instance of determination in the following step of the loading quantity on the basis of voltage and current phasor measurements 94. The second approach is appropriate, for example, where the PMUs provide voltage and current phasor measurements or where voltage and current phasor measurements or voltage and current phasor measurement information is received by the operator performing the monitoring process. The loading quantity according to the second approach is determined by way of:

$$|S|\angle\delta = \frac{|V_s|^2 - |V_s||V_r|(\cos(\theta) + i*\sin(\theta))}{Z_{eq}}$$

where $|S|\angle\delta$ is the loading quantity, $|V_s|$ is the voltage amplitude at the first location, $|V_r|$ is the voltage amplitude at the second location, $\theta$ is the difference between the voltage phase angles at the first and second locations, i.e. $\delta_s-\delta_r$, and $Z_{eq}$ is the complex series impedance. The complex series impedance is determined on the basis of the equation for $Z_{eq}$ provided above. Thereafter the second approach proceeds as per the first approach. More specifically the next step comprises comparing the determined loading quantity with the predetermined loading quantity 86. If the determined loading quantity is less than or equal to the predetermined loading quantity there is no constraint violation and no indication is provided to the operator and no rectifying action is taken 88. On the other hand if the determined loading quantity is greater than the predetermined loading quantity there is a constraint violation and at least one of: an indication of constraint violation is provided to the operator 90; and rectifying action is taken to control the electrical power network to bring the loading quantity within limit. As with the first approach the steps of determining the loading quantity and comparing the determined loading quantity with the predetermined loading quantity are repeated at an appropriate interval, such as once every second.

Figure 5:
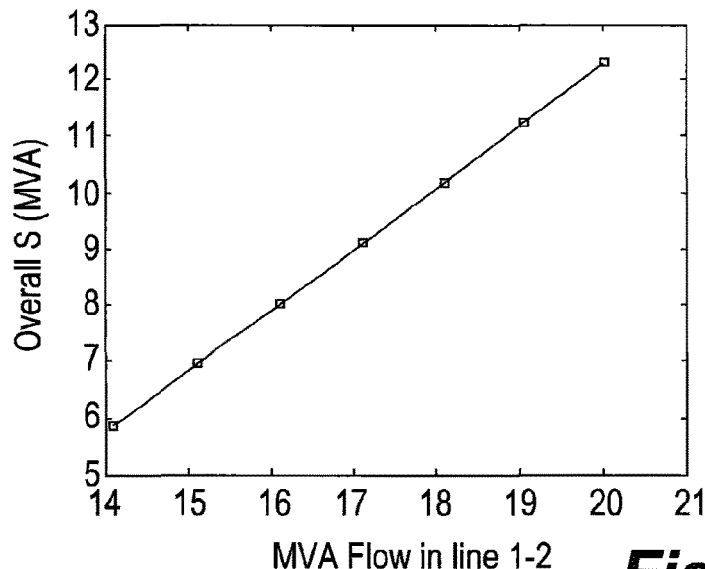
FIG. 5 shows the relationship in graphical form between loading quantity and power flow in a line of the network section of FIG. 3A.

The determination of a predetermined loading quantity for the electrical power network shown in FIG. 3A will now be described further by way of an example scenario and with reference to the graph shown in FIG. 5. As stated above worst-case network loading and generation scenarios are determined and then modelled. According to the present example loading at the first to fourth buses 52, 54, 56, 58 is at a minimum and the generator 70 at the second bus is producing 20 MW. The power output of the generator 64 at the fourth bus 58 is increased progressively in 1 MW steps. When the power output of the generator 64 at the fourth bus 58 reaches 6 MW it is found by way of modelling that the MVA flow in the line between the first and second buses 52, 54 is 20.04 MVA which is slightly above the thermal rating of 20 MVA for this line. This constitutes a thermal violation for this particular scenario. The predetermined loading quantity corresponding to the power flow in the line between the first and second buses is then determined by way of application of one of the two loading quantity equations specified above. More specifically and depending on which of the two loading quantity equations is used either voltage waveform data for each of the first and second locations or voltage and current waveform data for each of the first and second locations is applied to the loading quantity equation with the applied waveform data corresponding to a range of values of power output from the generator at the fourth bus sufficient to span the line thermal rating of 20 MVA. The loading quantities obtained from the loading quantity equation are then plotted against the corresponding MVA flow values in the line having the thermal constraint. Such a plot according to the present example is shown in FIG. 5. Careful examination of FIG. 5 shows that a loading quantity of 12.31 MVA is obtained when the thermal constraint value of 20 MVA is breached. The loading quantity of 12.31 MVA is thus the predetermined loading quantity to be used during monitoring of the network section as described above. Where other thermal constraints are to be taken into consideration the above approach is followed for each of the other constraints and the lowest of the predetermined loading quantities obtained is selected as the critical predetermined loading quantity for use during monitoring of the network section as described above.

Figure 6:
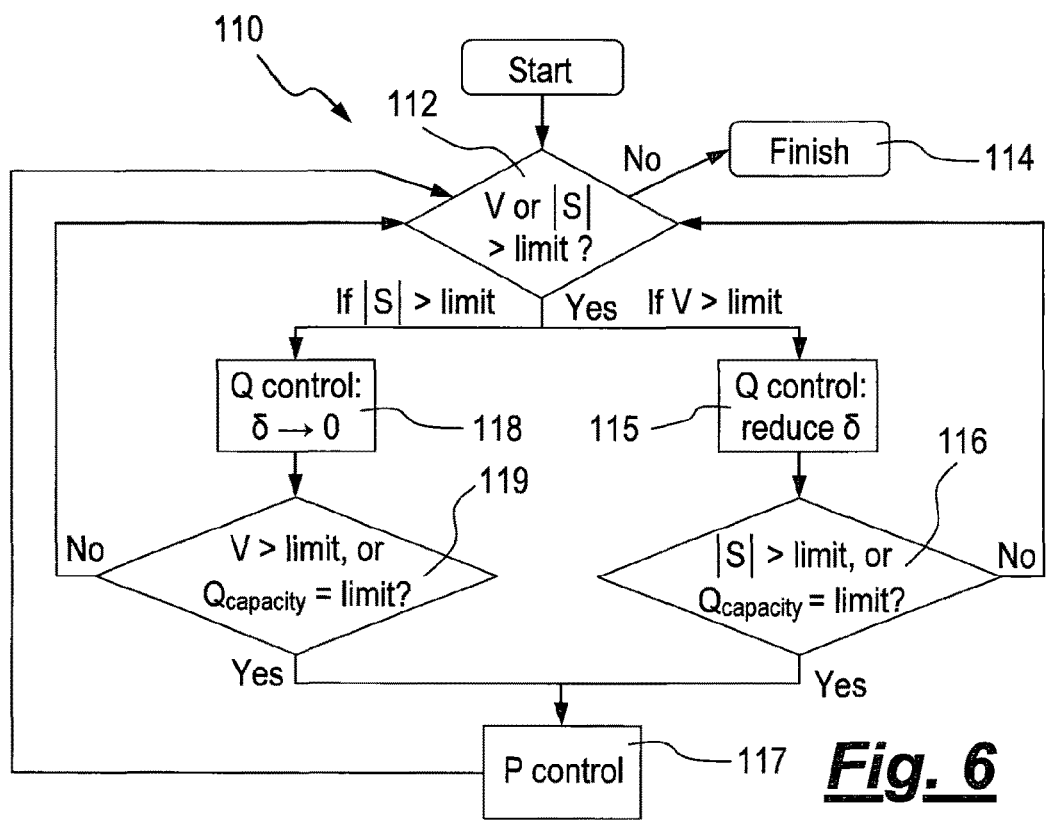
FIG. 6 is a flow chart representation of a method according to a first embodiment in which reactive and real power generation are controlled.

A flow chart representation of a method according to an embodiment in which reactive and real power generation are controlled 110 is shown in FIG. 6. Controlling reactive power generation and real power generation independently of each other confers economic advantages. More specifically it may under certain circumstances be advantageous to change reactive power generation in preference to real power generation. Controlling reactive power generation to mitigate a bus voltage may, however, lead to an increase in thermal flow. It is therefore advantageous to know when controlling reactive power generation is no longer appropriate such that real power generation should be controlled instead. According to the method of FIG. 6 it is assumed that a voltage constraint is managed by a method other than the method involving the loading quantity $|S|\angle\delta$ according to the invention which is employed for management of other constraints. Turning to consider the method of FIG. 6 as applied to an electrical power network as represented by way of example in FIG. 3A the first step 112 comprises determining whether or not there is a voltage limit violation or whether or not the loading quantity amplitude, $|S|$, exceeds the predetermined loading quantity amplitude. Determining whether or not there is a voltage limit violation comprises determining if at least one of the voltages at the first and fourth buses 52, 58 exceeds a predetermined value. If the predetermined value is not exceeded or if the loading quantity amplitude, |S|, does not exceed the predetermined loading quantity amplitude no control action is taken 114. If the predetermined value is exceeded the next step 115 is controlling reactive power generation to gradually decrease the imaginary part or angle δ of the loading quantity. A decrease in the angle δ of the loading quantity indicates that loading of the network section is more inductive whereby the voltage profile in the wider network is reduced. The following step 116 is determining whether or not the loading quantity amplitude, |S|, exceeds the predetermined loading quantity amplitude or whether or not the reactive power capacity has been reached. If the loading quantity amplitude, |S|, has not exceeded the predetermined loading quantity amplitude and the reactive power capacity has not been reached the method returns to the first step 112. If the loading quantity amplitude, |S|, has exceeded the predetermined loading quantity amplitude or the reactive power capacity has been reached, the next step 117 is reduction in real power generation, e.g. at the generator 64 at the fourth bus 58. Thereafter the method returns to the first step 112 whereby gradual control can be effected. If at the first step 112 the loading quantity amplitude, |S|, exceeds the predetermined loading quantity amplitude, the next step 118 is controlling reactive power generation to gradually move the angle δ of the loading quantity towards zero. Movement of the angle δ of the loading quantity towards zero indicates that the reactive power in the network section is reducing to thereby provide more room for real power flow. The following step 119 is determining whether or not there is a voltage limit violation or whether or not the reactive power capacity has been reached. If there is no voltage limit violation and the reactive power capacity has not been reached the method returns to the first step 112. If there is a voltage limit violation or the reactive power capacity has been reached, the next step 117 is reduction in real power generation. Thereafter the method returns to the first step 112 whereby gradual control can be effected.

Figure 7:
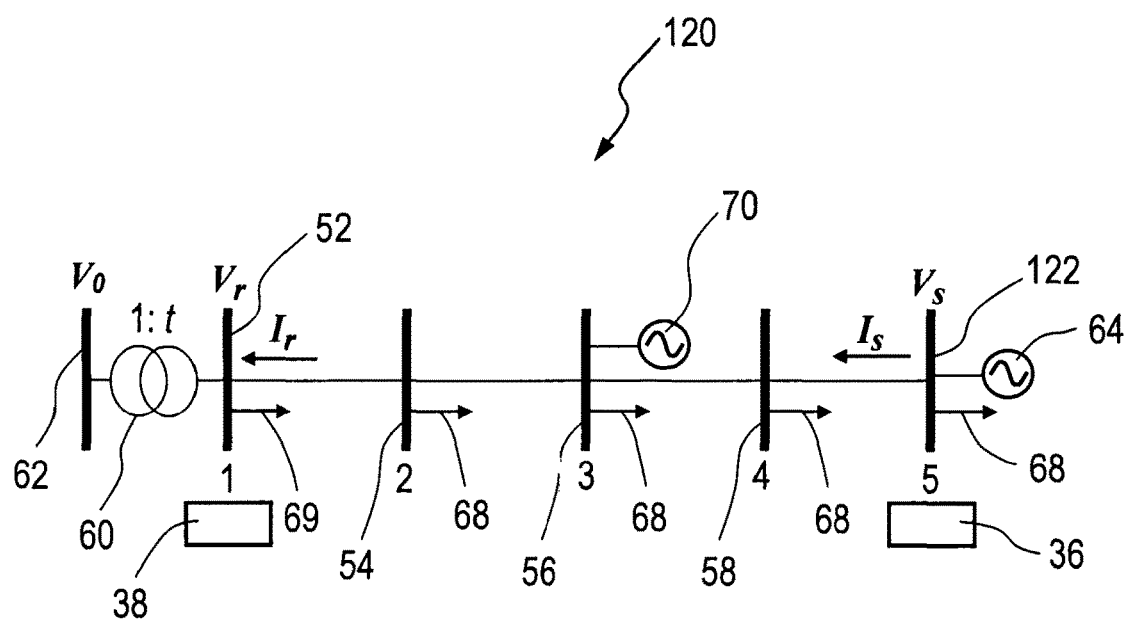
FIG. 7 is a representation of a network section and surrounding electrical power network according to a second embodiment of the present invention.
Figure 8:
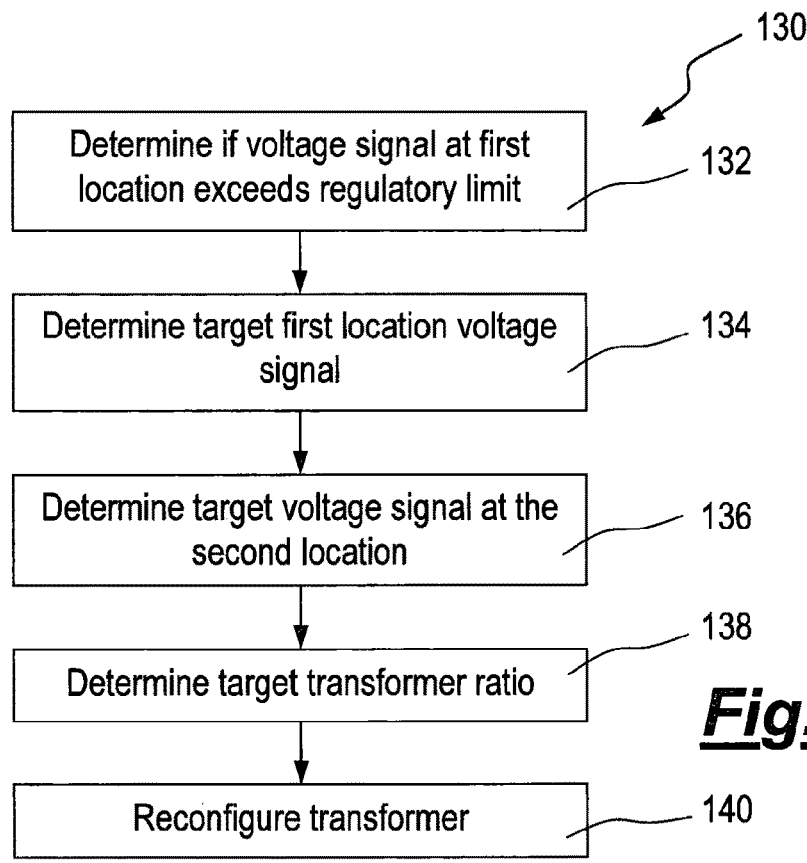
FIG. 8 is a flow chart representation of a method according to the second embodiment of the present invention.

A method according to a second embodiment of the present invention will now be described with reference to FIG. 7 which is a representation of a network section and surrounding electrical power network and FIG. 8 which provides a flow chart representation 130 of steps involved in the method. The second embodiment involves determining on the basis of measurements made by first and second PMUs 36, 38 at respective first and second network section boundary locations either a target voltage signal at the transformer 60 or a target transformer ratio which is required to bring a voltage signal in the network section within regulatory limits. The network section and surrounding electrical power network 120 of FIG. 7 will be considered first. Components in common with the network section and surrounding electrical power network of FIG. 3A are designated in FIG. 7 by common reference numerals. The reader should refer to the description provided above with reference to FIG. 3A for a description of such common components. Components particular to FIG. 7 will now be described. FIG. 3A shows a four bus radial distribution network whereas FIG. 7 shows a five bus radial distribution network. The network of FIG. 7 therefore comprises a fifth bus 122 with the first PMU 36 making measurements at the fifth bus 122 instead of the fourth bus 58 and the renewable energy generator 64 being connected to the fifth bus 122 instead of the fourth bus 58. Furthermore the further generator 70 is connected to the third bus 56 instead of the second bus 54. The first and fifth buses 52, 122 therefore define a boundary of the network section at which measurements are made by the first and second PMUs 36, 38 at respective first and second locations. Turning now to the flow chart of FIG. 8 the method according to the second embodiment will now be described. The first step of the method comprises determining if the voltage signal at the first location, i.e. at the fifth bus 122 as measured by the first PMU 36, exceeds a regulatory limit 132. If the voltage signal at the first location exceeds the regulatory limit a target first location voltage signal, $V_{ref}$, is then determined 134, the target first location voltage signal being within the regulatory limit. Then the target voltage signal, $V_{r\_new}$, at the second location is determined 136, the target voltage signal being a new voltage signal at the second location which is required to change the voltage signal at the first location to the target first location voltage. The target voltage signal is calculated by way of:

$$V_{r\_new} = \frac{V_{ref} \pm \sqrt{V_{ref}^2 - 4V_r(V_s - V_r)}}{2}$$

where $V_{r\_new}$ is the target voltage signal, $V_{ref}$ is the target first location voltage signal, $V_r$ is a voltage phasor corresponding to a voltage signal amplitude and a voltage signal phase at the second location and $V_s$ is a voltage phasor corresponding to a voltage signal amplitude and a voltage signal phase at the first location. Thereafter a target transformer ratio is determined 138 for the transformer 60 at the first bus 52. The target transformer ratio is calculated by way of:

ratio=$V_{r\_new}/V_r$.

Alternatively the target transformer ratio is calculated directly by way of:

$$\text{ratio} = \frac{V_{ref} \pm \sqrt{V_{ref}^2 - 4V_r(V_s - V_r)}}{2V_r}$$

The transformer 60 at the first bus 52 is then reconfigured to have the thus determined target transformer ratio 140 by changing the transformer tap position to thereby reduce the voltage signal on the low, i.e. first bus 52 side, of the transformer which in turn brings the voltage signal at the first location, i.e. at the fifth bus 122, to within limit. Where the present tap position, $t_{old}$, for the transformer is known a new position for the transformer can be determined in dependence on the present tap position and the target transformer ratio. More specifically the present tap position is calculated by way of: $t_{new}=t_{old}\times$ratio. The method of the second embodiment is employed in the reactive and real power generation control method shown in FIG. 6, although transformer control is not shown in FIG. 6. After steps 118 and 124 but before step 120 (i.e. real power generation control) of the method of FIG. 6 the reactive and real power generation control method comprises controlling the transformer in accordance with the second embodiment. After the transformer control step the reactive and real power generation control method returns to the first step 112.

Figure 9:
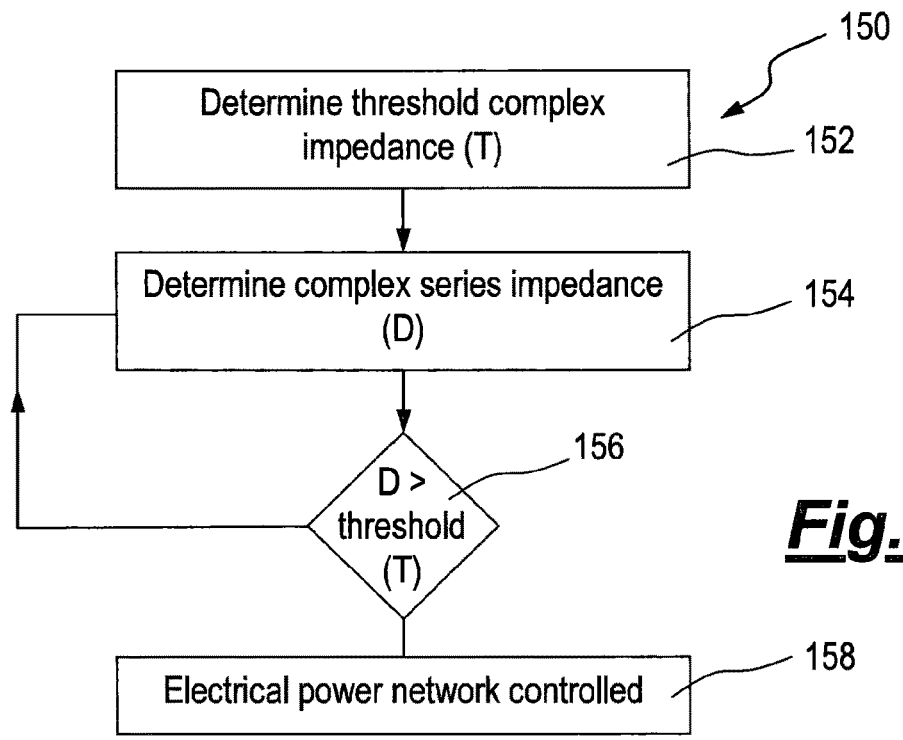
FIG. 9 is a flow chart representation of a method according to the third embodiment of the present invention.

A method according to a third embodiment of the present invention will now be described with reference to FIG. 3A which is a representation of a network section and surrounding electrical power network and FIG. 9 which provides a flow chart representation 150 of steps involved in the method. The third embodiment involves detecting a change in a loading condition of a network section 34 and controlling the electrical power network where this is warranted by an extent of the detected change. The change in the network section is reflected in the complex series impedance, $Z_{eq}$, of an electrical model of the network section. The first step of the method according to the third embodiment is determination of a threshold complex impedance by off-line simulations of various scenarios 152. The next step is determination of the change reflecting complex series impedance, $Z_{eq}$, 154. The complex series impedance, $Z_{eq}$, is calculated by way of:

$$Z_{eq} = \left(V_s - V_r \times \frac{I_s V_s + I_r V_r}{I_s V_r + I_r V_s}\right) / I_r$$

where $V_s$ is the voltage phasor at the first location (i.e. at the fourth bus), $V_r$ is the voltage phasor at the second location (i.e. at the first bus), $I_s$ is the current phasor at the first location and $I_r$ is the current phasor at the second location. Then the determined complex series impedance is compared with the threshold complex impedance 156. The threshold complex impedance 156 may be either an upper threshold value or a lower threshold value. If the determined complex series impedance is less than or equal to the upper threshold complex impedance the complex series impedance is determined again 154 and the comparison step 156 is repeated. If the determined complex series impedance is greater than the upper threshold complex impedance, this is indicative of a change that requires intervention and therefore control is exerted over the electrical power network 158. Control is exerted, for example, by more conservative utilisation of the network section 34 to reduce the likelihood of the upper threshold complex impedance being exceeded or to bring the complex series impedance within the upper threshold complex impedance. Where the threshold complex impedance 156 is a lower threshold value and a determined complex series impedance is less than the lower threshold complex impedance, this is also indicative of a change that requires intervention.

Figure 10:
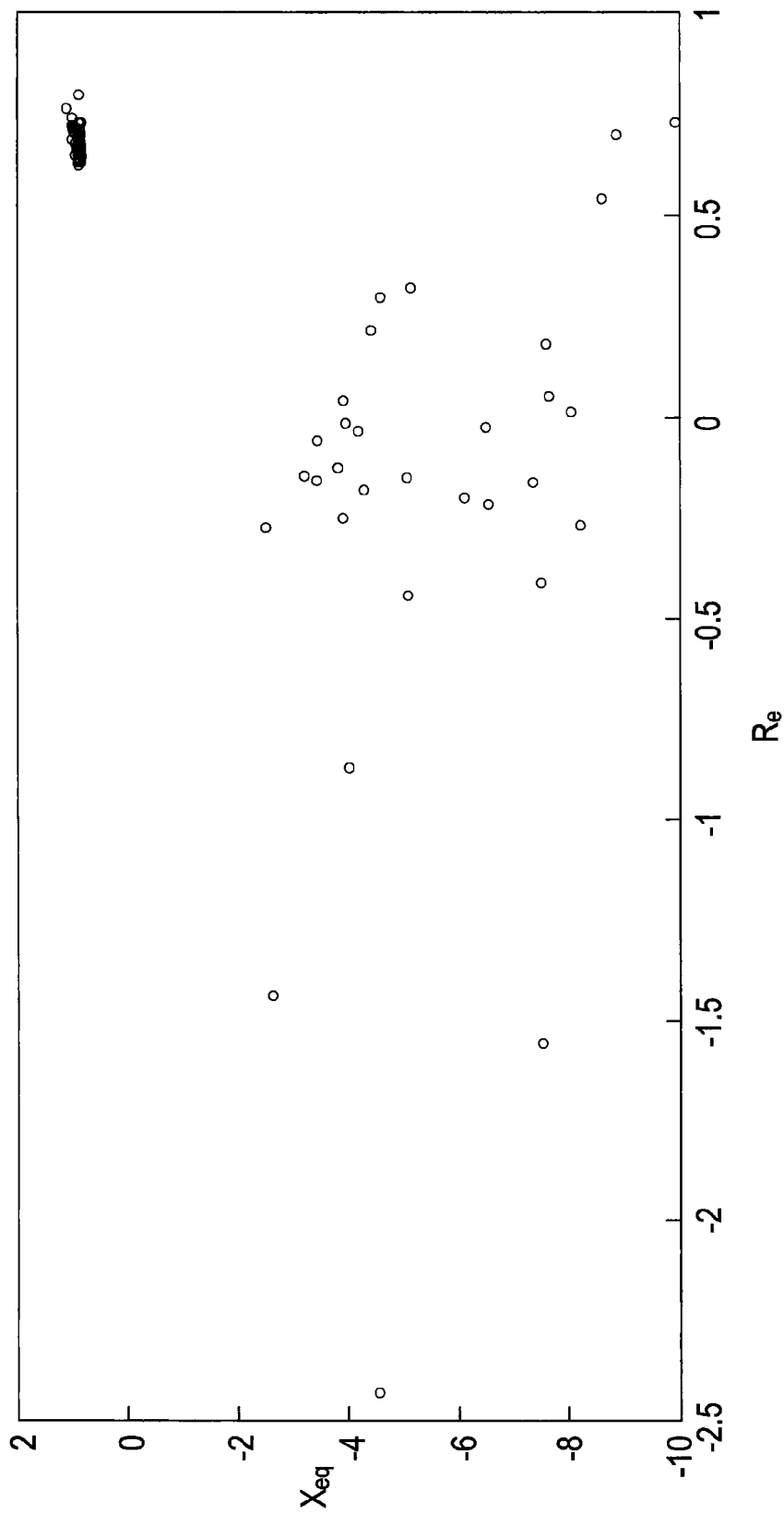
FIG. 10 is plot of equivalent reactance against equivalent resistance for the third embodiment.

Operation of the third embodiment is illustrated by way of FIG. 10. FIG. 10 is a plot of equivalent reactance, $X_{eq}$, against equivalent resistance, $R_{eq}$, where $Z_{eq}=R_{eq}+X_{eq}$. Each circle plotted in FIG. 10 represents the equivalent reactance and equivalent resistance obtained by way of measurements made at the first and second locations under different circumstances involving the tripping or disconnection of a transmission line. The circular plots clustered together in the top right hand corner of the plot of FIG. 10 relate to disconnection events outside the network section 34. The remaining, scattered circular plots relate to disconnection events within the network section 34 between the first and second locations. It can therefore be appreciated from an inspection of FIG. 10 that the third embodiment provides an effective means of detecting a change in a loading condition of the network section which warrants intervention.

The invention claimed is:

1. A method of determining a condition of a network section comprised in an electrical power network, the network section being configured such that electrical power flows to or from each of plural locations in the network section, the method comprising:
   receiving a first quantity in respect of a first location in the network section and receiving a second quantity in respect of a second location in the network section, each of the first and second quantities corresponding to a signal amplitude and a signal phase angle at its respective location; and
   determining a condition quantity corresponding to a loading condition of the network section between the first and second locations in dependence on the first and second quantities,
   wherein there being plural electrical power flows to or from the network section at respective further locations between the first and second locations in the network section,
   wherein the condition quantity being determined in dependence on an electrical model of the network section between the first and second locations, the electrical model comprising a series impedance between the first and second locations and at least one shunt impedance between the series impedance and a reference potential,
   wherein determining the condition quantity comprises determining a loading quantity for the network section in dependence on first and second signal amplitudes and a difference between first and second signal phase angles, and
   wherein the loading quantity is calculated by way of:

$$|S|\angle\delta = \frac{|V_s|^2 - |V_s||V_r|(\cos(\theta) + i*\sin(\theta))}{Z_{eq}}$$

where $|S|\angle\delta$ is the loading quantity, $|V_s|$ is the voltage amplitude at the first location, $|V_r|$ is the voltage amplitude at the second location, $\theta$ is the difference between the voltage phase angles at the first and second locations and $Z_{eq}$ is calculated by way of:

$$Z_{eq} = \left(V_s - V_r \times \frac{I_s V_s + I_r V_r}{I_s V_r + I_r V_s}\right) / I_r$$

where $Z_{eq}$ is the series impedance, $V_s$ is the voltage phasor at the first location, $V_r$ is the voltage phasor at the second location, $I_s$ is the current phasor at the first location and $I_r$ is the current phasor at the second location.

2. The method according to claim 1 further comprising:
   determining whether or not there is a voltage limit violation in the network section, which comprises determining whether or not a voltage amplitude at at least one of the first location and the second location exceeds a predetermined value; and
   controlling reactive power output of apparatus comprised in the electrical power network in dependence on the voltage limit violation determination.

3. The method according to claim 1 further comprising:
   determining whether or not there is a voltage limit violation in the network section, which comprises determining whether or not a loading quantity amplitude exceeds a predetermined loading quantity amplitude; and
   controlling real power output of apparatus comprised in the electrical power network in dependence on at least one of the loading quantity amplitude determination and a reactive power capacity being exceeded.

4. The method according to claim 3 further comprising forming a model of the network section and changing an operating circumstance of the model until a constraint violation occurs.

5. A method of determining a condition of a network section comprised in an electrical power network, the network section being configured such that electrical power flows to or from each of plural locations in the network section, the method comprising:
receiving a first quantity in respect of a first location in the network section and receiving a second quantity in respect of a second location in the network section, each of the first and second quantities corresponding to a signal amplitude and a signal phase angle at its respective location; and
determining a condition quantity corresponding to a loading condition of the network section between the first and second locations in dependence on the first and second quantities,
wherein there being plural electrical power flows to or from the network section at respective further locations between the first and second locations in the network section,
wherein the condition quantity being determined in dependence on an electrical model of the network section between the first and second locations, the electrical model comprising a series impedance between the first and second locations and at least one shunt impedance between the series impedance and a reference potential, and
wherein determining the condition quantity comprises determining whether or not a thermal constraint is being violated and determining whether or not a thermal constraint is being violated comprises comparing a determined loading quantity with a predetermined loading quantity.

6. The method according to claim 5 in which determining the condition quantity does not depend on a further quantity received in respect of each of the further locations between the first and second locations.

7. The method according to claim 5 in which determining the condition quantity comprises determining at least one of: whether or not a voltage constraint between the first and second locations is being breached; if there has been a loading condition affecting change in the configuration of the network section between the first and second locations; and if there has been a loading condition affecting change in the configuration of the electrical power network.

8. The method according to claim 5 in which the condition quantity is determined in dependence on complex signals which reflect amplitude and phase information.

9. The method according to claim 5 in which the electrical power flows to and from the network section between the first and second locations are caused by electrical arrangements which are operative to at least one of source electrical energy to or sink electrical energy from the network section, each electrical arrangement comprising at least one of: a transmission or distribution line which is operative to convey electrical power to or from the network section; electrical apparatus which is operative to electrically load the network section; a generator; and energy storage apparatus.

10. The method according to claim 5 further comprising controlling the electrical power network in dependence on whether or not there is a thermal constraint violation.

11. A computer program comprising program instructions for causing a computer to perform the method according to claim 5.

12. A method of determining a condition of a network section comprised in an electrical power network, the network section being configured such that electrical power flows to or from each of plural locations in the network section, the method comprising:
receiving a first quantity in respect of a first location in the network section and receiving a second quantity in respect of a second location in the network section, each of the first and second quantities corresponding to a signal amplitude and a signal phase angle at its respective location;
determining a condition quantity corresponding to a loading condition of the network section between the first and second locations in dependence on the first and second quantities; and
determining at least one of: a target voltage signal at the second location and a target transformer ratio for a transformer which is electrically coupled to the second location, the determination being made in dependence on voltage signals measured at the first and second locations in the network section, the first location being subject to a voltage signal limit,
wherein there being plural electrical power flows to or from the network section at respective further locations between the first and second locations in the network section, and
wherein the condition quantity being determined in dependence on an electrical model of the network section between the first and second locations, the electrical model comprising a series impedance between the first and second locations and at least one shunt impedance between the series impedance and a reference potential.

13. The method according to claim 12 in which the target voltage signal is determined, the target voltage signal being calculated by way of:

$$V_{r\_new} = \frac{V_{ref} \pm \sqrt{V_{ref}^2 - 4V_r(V_s - V_r)}}{2}$$

where $V_{r\_new}$ is the target voltage signal, $V_{ref}$ is the target first location voltage signal, $V_r$ is a voltage phasor corresponding to a voltage signal amplitude and a voltage signal phase at the second location and $V_s$ is a voltage phasor corresponding to a voltage signal amplitude and a voltage signal phase at the first location.

14. The method according to claim 12 in which the target transformer ratio is determined, the target transformer ratio being calculated by way of:

$$\text{ratio} = \frac{V_{ref} \pm \sqrt{V_{ref}^2 - 4V_r(V_s - V_r)}}{2V_r}$$

where ratio is the target transformer ratio, $V_{ref}$ is the target first location voltage signal, $V_r$ is a voltage phasor corresponding to a voltage signal amplitude and a voltage signal phase at the second location and $V_s$ is a voltage phasor corresponding to a voltage signal amplitude and a voltage signal phase at the first location.

15. Apparatus for determining a condition of a network section comprised in an electrical power network, the network section being configured such that electrical power flows to or from each of plural locations in the network section, the apparatus receiving a first quantity in respect of a first location in the network section and receiving a second quantity in respect of a second location in the network section, each of the first and second quantities corresponding to a signal amplitude and a signal phase angle at its respective location, and the apparatus comprising a processor which is operative to determine a condition quantity corresponding to a loading condition of the network section between the first and second locations in dependence on the first and second quantities, wherein there being plural electrical power flows to or from the network section at a respective further location between the first and second locations in the network section, wherein the condition quantity being determined in dependence on an electrical model of the network section between the first and second locations, the electrical model comprising a series impedance between the first and second locations and at least one shunt impedance between the series impedance and a reference potential, and wherein determining the condition quantity comprises determining whether or not a thermal constraint is being violated and determining whether or not a thermal constraint is being violated comprises comparing a determined loading quantity with a predetermined loading quantity.

16. An electrical power network comprising a network section and apparatus according to claim 15.

17. Apparatus for determining a condition of a network section comprised in an electrical power network, the network section being configured such that electrical power flows to or from each of plural locations in the network section, the apparatus receiving a first quantity in respect of a first location in the network section and receiving a second quantity in respect of a second location in the network section, each of the first and second quantities corresponding to a signal amplitude and a signal phase angle at its respective location, and the apparatus comprising a processor which is operative to determine a condition quantity corresponding to a loading condition of the network section between the first and second locations in dependence on the first and second quantities, wherein the condition quantity being determined in dependence on an electrical model of the network section between the first and second locations, the electrical model comprising a series impedance between the first and second locations and at least one shunt impedance between the series impedance and a reference potential, wherein determining the condition quantity comprises determining a loading quantity for the network section in dependence on first and second signal amplitudes and a difference between first and second signal phase angles, and wherein the loading quantity is calculated by way of:

$$|S|\angle\delta = \frac{|V_s|^2 - |V_s||V_r|(\cos(\theta) + i*\sin(\theta))}{Z_{eq}}$$

where $|S|\angle\delta$ is the loading quantity, $|V_s|$ is the voltage amplitude at the first location, $|V_r|$ is the voltage amplitude at the second location, $\theta$ is the difference between the voltage phase angles at the first and second locations and $Z_{eq}$ is calculated by way of:

$$Z_{eq} = \left(V_s - V_r \times \frac{I_s V_s + I_r V_r}{I_s V_r + I_r V_s}\right) / I_r$$

where $Z_{eq}$ is the series impedance, $V_s$ is the voltage phasor at the first location, $V_r$ is the voltage phasor at the second location, $I_s$ is the current phasor at the first location and $I_r$ is the current phasor at the second location.

18. Apparatus for determining a condition of a network section comprised in an electrical power network, the network section being configured such that electrical power flows to or from each of plural locations in the network section, the apparatus receiving a first quantity in respect of a first location in the network section and receiving a second quantity in respect of a second location in the network section, each of the first and second quantities corresponding to a signal amplitude and a signal phase angle at its respective location, and the apparatus comprising a processor which is operative to determine a condition quantity corresponding to a loading condition of the network section between the first and second locations in dependence on the first and second quantities, wherein at least one of a target voltage signal at the second location and a target transformer ratio for a transformer which is electrically coupled to the second location is determined, the determination being made in dependence on voltage signals measured at the first and second locations in the network section, the first location being subject to a voltage signal limit, wherein there being plural electrical power flows to or from the network section at respective further locations between the first and second locations in the network section, and wherein the condition quantity being determined in dependence on an electrical model of the network section between the first and second locations, the electrical model comprising a series impedance between the first and second locations and at least one shunt impedance between the series impedance and a reference potential.

* * * * *